United States Patent [19]

Mitani et al.

[11] Patent Number: 5,203,924
[45] Date of Patent: Apr. 20, 1993

[54] METHOD OF AND APPARATUS FOR SYNTHESIZING DIAMONDLIKE THIN FILM

[75] Inventors: Tsutomu Mitani, Akashi; Hirokazu Nakaue, Higashiosaka; Hideo Kurokawa, Katano, all of Japan

[73] Assignee: Matsushita Electric Industrial Co., Ltd., Osaka, Japan

[21] Appl. No.: 558,241

[22] Filed: Jul. 26, 1990

[30] Foreign Application Priority Data

Jul. 31, 1989 [JP] Japan ................................. 1-198986
Nov. 17, 1989 [JP] Japan ................................. 1-300503

[51] Int. Cl.$^5$ ................................. C23C 16/00
[52] U.S. Cl. ................................. 118/719; 118/723; 427/533; 427/534; 427/569
[58] Field of Search .................... 118/723, 719; 427/39

[56] References Cited

U.S. PATENT DOCUMENTS 4,645,977  2/1987  Kurokawa et al. ................. 118/715

FOREIGN PATENT DOCUMENTS 0183254  6/1986  European Pat. Off. .
0253361  1/1988  European Pat. Off. .
2128637  5/1984  United Kingdom .

OTHER PUBLICATIONS

Bulletin of Lectures of the 33rd Conference of the Japan Society of Applied Physics, 3p-ZD-14, 1986.
Whitmell et al., "Thin Solid Films", vol. 35, pp. 255-261, (1986).
Yamamoto et al., "Bulletin of the Japan Society of Precision Engineering", vol. 55, No. 12, pp. 2222-2227, (1989).

Primary Examiner—Richard Bueker
Attorney, Agent, or Firm—Wenderoth, Lind & Ponack

[57] ABSTRACT

A method of and an apparatus for synthesizing a diamondlike thin film on a substrate, the method comprising the steps of: generating plasma of gas containing hydrocarbon gas, in a first vacuum vessel having an inflow portion and an outflow portion for the gas such that the substrate is provided in a second vacuum vessel maintained at a pressure lower, by one figure or more, than that of the first vacuum vessel due to flow resistance of the gas between the outflow portion and the substrate; and irradiating the plasma onto the substrate by pressure difference between the first vacuum vessel and the second vacuum vessel while an AC power is being applied to at least one of the substrate and an internal electrode provided in the first vacuum vessel.

4 Claims, 9 Drawing Sheets

METHOD OF AND APPARATUS FOR SYNTHESIZING DIAMONDLIKE THIN FILM

BACKGROUND OF THE INVENTION

The present invention generally relates to a method of and an apparatus for synthesizing a diamondlike thin film by using plasma of hydrocarbon gas. Especially, the present invention is characterized in that an excellent diamondlike thin film can be synthesized also on an insulating substrate in the same manner as on an electrically conductive substrate.

A diamondlike thin film has excellent characteristics of hardness, electric resistance, light transmittance, etc. equivalent to those of diamond and is expected to be applied to wear-resistant protective films for various electronic apparatuses or components and passivation films. Various methods of and apparatuses for synthesizing the diamondlike thin film are known. As shown in FIG. 1, an RF plasma CVD apparatus is proposed as one of such synthesis apparatuses by Kito et al. in a Bulletin of Lectures of the 33rd Conference of the Japan Society of Applied Physics, 3p-ZD-14 held in 1986. The prior art RF plasma CVD apparatus includes an upper electrode 117, a lower electrode 120 and a substrate 119 made of $SiO_2$. The substrate 119 is placed on the lower electrode 120. After a vacuum vessel 122 has been evacuated, benzene gas 118 is introduced into the vacuum vessel 122. Subsequently, when an RF power is applied to the lower electrode 120 by an RF power source 121 of 13.56 MHz, plasma 124, which includes radicals and ions containing carbon, a constituent element of the diamondlike thin film, is produced. By depositing these ions and radicals on the substrate 119, the diamondlike thin film having a Knoop hardness of about 3000 is synthesized on the substrate 119. As will be seen from FIG. 1, when an AC power such as an RF power is applied to the lower electrode having the substrate placed thereon such that plasma of hydrocarbon gas is generated, the diamondlike thin film of high quality can be synthesized not only on a substrate made of electrically conductive material such as metals but on a substrate made of insulating material such as glass.

This can be explained as follows. Namely, when the AC power is applied to plasma, electric potential at which the substrate is lower, in electric potential, than plasma, namely, so-called self-bias potential is produced due to difference in mobility between ions and electrons in plasma. Not only the ions are accelerated towards the substrate so as to be deposited on the substrate but the ions of positive charge deposited on the substrate are neutralized by electrons in plasma, which is a well-known fact.

It is also possible to synthesize the diamondlike thin film by using a known DC plasma CVD apparatus as described by Whitmell et al. in a magazine entitled "Thin Solid Films", Vol. 35 (1976), p. 255–261. However, in the case of the insulating substrate, ions are charged to positive charge on the insulating substrate undesirably. Thus, in order to synthesize the diamondlike thin film on the insulating substrate, it is necessary to further provide a neutralization means such as an electron irradiating means.

The above described known synthesis apparatuses have several drawbacks. One of the drawbacks is that the diamondlike thin film synthesized on the substrate is nonuniform in hardness and thickness. This is because gas flow, gas pressure and plasma state are made nonuniform by the substrate, the electrodes, the vacuum vessel, etc. in the arrangement of the known synthesis apparatus of FIG. 1. Furthermore, since these nonuniformities are affected also by synthesis conditions of the diamondlike thin film such as shape and size of each of the substrate, the electrodes and the vacuum vessel, gas pressure of the vacuum vessel, flow rate of the gas, the applied electric power, etc., it is difficult to eliminate the nonuniformities. Furthermore, in the case where synthesis of the diamondlike thin film is put to practical use industrially by synthesizing the diamondlike thin film on the substrate having a large area, such nonuniformities pose a serious problem.

Another drawback of the known synthesis apparatuses is that abnormal discharge such as arc discharge is likely to take place between the lower electrode and the vacuum vessel in FIG. 1 according to the synthesis conditions in which, for example, the RF power, the gas pressure, etc. are increased in order to raise synthesis speed, so that it becomes difficult to synthesize the diamondlike thin film stably. Namely, since in the arrangement of the known synthesis apparatus of FIG. 1, the gas pressure of the vacuum vessel is substantially identical with pressure in the vicinity of the electrodes for forming the film and the vacuum vessel has ground potential relative to the lower electrode for receiving the electric power, plasma is generated in the vacuum vessel as a whole and thus, arc discharge readily takes place between the lower electrode and substances adhering to the vacuum vessel, projections on the vacuum vessel, etc.

Moreover, since plasma of hydrocarbon gas is generated in the vacuum vessel as a whole as described above, the film adheres also to the wall of the vacuum vessel, a substrate support in the vacuum vessel, etc. As a result, it becomes necessary to perform maintenance operations such as cleaning of the whole vacuum vessel, which is troublesome.

Still another drawback of the known synthesis apparatuses is that when synthesis of the diamondlike thin film is put to practical use industrially by synthesizing the diamondlike thin film on various electronic apparatuses, components, etc., synthesis speed of the diamondlike thin film is unsatisfactorily as low as 100 Å/min.

In addition, in the known DC plasma CVD apparatus, it is necessary to provide the electron irradiating means in order to synthesize the diamondlike thin film on the insulating substrate, thereby resulting in not only rise of its production cost but complication of the arrangement and the synthesis operations.

Owing to the above described disadvantages, it has been conventionally difficult to put synthesis of the diamondlike thin film to practical use industrially.

SUMMARY OF THE INVENTION

Accordingly, an essential object of the present invention is to provide, with a view to eliminating the above described inconveniences, a method of and an apparatus for synthesizing a diamondlike thin film, by which the diamondlike thin film of high quality can be synthesized also on a insulating substrate without the need for additionally providing an electron irradiating means, etc.

In order to accomplish this object of the present invention, a method of synthesizing a diamondlike thin film on a substrate, according to a first aspect of the present invention comprises the steps of: generating plasma of gas containing hydrocarbon gas, in a first vacuum vessel having an inflow portion and an outflow portion for the gas such that the substrate is provided in a second vacuum vessel maintained at a pressure lower, by one figure or more, than that of the first vacuum vessel due to flow resistance of the gas between the outflow portion and the substrate; and irradiating the plasma onto the substrate by pressure difference between the first vacuum vessel and the second vacuum vessel while an RF power is being applied to at least one of the substrate and an internal electrode.

Meanwhile, a method according to a second aspect of the present invention comprises the steps of: generating plasma of gas containing hydrocarbon gas, in a first vacuum vessel, with a mesh type electrode for partially or wholly removing ions in the plasma so as to obtain particles containing radicals being subjected to a potential and being provided in a flow path of the plasma; and irradiating the particles onto the substrate provided in a second vacuum vessel having a pressure lower than that of the first vacuum vessel.

In the first aspect of the present invention, when the AC power is applied, through the substrate or the internal electrode provided in the first vacuum vessel, to the plasma of the hydrocarbon gas generated in the first vacuum vessel, self-bias potential is generated in the substrate. Thus, in order to synthesize the diamondlike thin film, ions in the plasma are irradiated together with the plasma, while being accelerated towards the substrate by this self-bias potential, onto the substrate which is provided in the second vacuum vessel maintained at the pressure lower, by one figure or more, than that of the first vacuum vessel due to flow resistance of the gas between the outflow portion and the substrate. When pressure difference of one figure or more is generated between the first and second vacuum vessels as described above, flow state of the gas at the outflow portion of the first vacuum vessel acting as a synthesis portion of the diamondlike thin film, pressure of the gas and plasma state are made uniform and thus, it becomes possible to synthesize the diamondlike thin film having uniform characteristics and thickness. At this time, since the self-bias potential is generated in the same manner as in the prior art referred to earlier when the AC power is applied to the substrate, the diamondlike thin film can be synthesized.

Meanwhile, also when the AC power is applied to the internal electrode provided in the first vacuum vessel, the self-bias potential is generated as in the case of the above mentioned application of the AC power to the substrate, so that it becomes possible to synthesize the diamondlike thin film. This reason is described briefly. Assuming that character As denotes an area of contact of the substrate with the plasma generated at the substrate and character Vs denotes magnitude of the self-bias potential generated at the substrate, character Ae denotes an area of contact of the internal electrode with the plasma generated at the internal electrode and character Ve denotes magnitude of the self-bias potential generated at the internal electrode, the following relation is obtained:

$$Vs/Ve = (Ae/As)^n$$

where n is a number of 1–4.

Thus, the magnitude Vs of the self-bias potential generated at the substrate can be adjusted by magnitude of the applied AC power and the ratio (Ae/As) as described in a book entitled "Basic Plasma Processing" (translation of the Japanese title), p. 145 written by Brian N. Chapman and translated by Yukio Okamoto. Namely, if the AC power is applied to at least one of the substrate and the internal electrode provided in the first vacuum vessel, an AC field can be applied to the plasma and thus, the diamondlike thin film can be synthesized by setting the magnitude Vs at a value suitable for synthesis of the diamondlike thin film by the above adjustment. Especially, in the case where the AC power is applied to the internal electrode, the following advantages are obtained in comparison with the case of application of the AC power to the substrate. Namely, when the AC power is applied to the substrate, the second vacuum vessel assumes ground potential relative to the substrate and thus, potential difference is generated between the substrate and the second vacuum vessel. In this case, characteristics and thickness of the synthesized diamondlike thin film are substantially uniform. However, if the AC power or pressure in the second vacuum vessel exceeds a predetermined value, plasma or arc discharge may be generated also in the second vacuum vessel undesirably.

Furthermore, in the case where the diamondlike thin film is generated on the cylindrical substrate by rotating the substrate, a complicated multipoint contact configuration should be employed in a connector for applying the AC power source. Moreover, since this connector has a high impedance, a large amount of the AC power is consumed at the connector, thereby resulting in rise in temperature of the connector. In addition, abnormal discharge such as arc discharge is likely to take place at the connector undesirably.

On the contrary, in the case where the AC power is applied to the internal electrode, the substrate or the support member for supporting the substrate assumes ground potential in the same manner as the second vacuum vessel. As a result, the plasma is least likely to take place in the second vacuum vessel. Furthermore, the above described problems arising during application of the AC power to the cylindrical substrate, such as rise of temperature of the connector due to consumption of a large amount of the AC power at the connector and generation of abnormal discharge can be restricted.

In the present invention, the AC power source for generating the self-bias potential may act also as a plasma generating means or may be provided separately from the plasma generating means.

Meanwhile, when output frequency of the AC power source is lower than 1 kHz, the plasma exhibits property of plasma generated by DC discharge, so that neutralization of ions by electrons in the plasma is less likely to take place and thus, it becomes difficult to synthesize the diamondlike thin film on an insulating substrate. On the other hand, when output frequency of the AC power is higher than 100 MHz, there is substantially no difference in mobility between electrons and ions in the plasma and thus, the self-bias potential sufficient for synthesizing the diamondlike thin film is not generated undesirably. For the above described reasons, output frequency of the AC power source employed in the present invention ranges from 1 kHz to 100 MHz, more preferably, from 100 kHz to 50 MHz.

Furthermore, since pressure in the first vacuum vessel is higher, by one figure or more, than that of the second vacuum vessel, the plasma is likely to be generated in the first vacuum vessel. Once the plasma has been generated in the first vacuum vessel as described above, the AC power is readily consumed in the plasma generating means having a small impedance, namely the first vacuum vessel and therefore, leakage of the plasma into the second vacuum vessel is lessened. For this reason together with the fact that the pressure in the second vacuum vessel is low, generation of the plasma in the second vacuum vessel and further, abnormal discharge such as arc discharge are restricted. As a result, substances are less likely to adhere to walls of the vacuum vessels, etc. In addition, even if, for example, the AC power, pressure of the gas, etc. are increased in order to raise synthesis speed of the diamondlike thin film, abnormal discharge such as arc discharge is least likely to take place and thus, the diamondlike thin film can be synthesized stably.

Furthermore, in the present invention, since radicals, ions containing carbon, etc. generated in the first vacuum vessel can be efficiently irradiated onto the substrate by pressure difference between the first and second vacuum vessels, the hydrocarbon gas is utilized highly efficiently and thus, the diamondlike thin film can be synthesized at higher speed than the prior art.

In the second aspect of the present invention, the potential is applied to the mesh type electrode in the flow path of the plasma of the hydrocarbon gas and particles containing radicals which are obtained by partially or wholly removing ions in the plasma, are irradiated onto the substrate provided in the second vacuum vessel having a pressure lower than that of the first vacuum vessel. Therefore, since the diamondlike thin film is synthesized without collision of the ions with the substrate, electric charging of the ions is not problematical substantially and the diamondlike thin film can be synthesized even on an insulating substrate susceptible to damage, for example, a substrate made of organic photosensitive material.

Especially, in the case where the substrate is provided at such a position as to set a pressure in the second vacuum vessel lower, by one figure or more, than that of the first vacuum vessel due to flow resistance of the gas between the outflow portion and the substrate, flow state of the gas at the synthesis portion of the diamondlike thin film, pressure of the gas and plasma state can be made uniform and thus, the diamondlike thin film having uniform characteristics and thickness can be synthesized in the same manner as in the first aspect of the present invention.

Meanwhile, since pressure in the first vacuum vessel is higher than that of the second vacuum vessel, the plasma is likely to be generated in the first vacuum vessel. Furthermore, since pressure in the second vacuum vessel is low, generation of the plasma in the second vacuum vessel and abnormal discharge such as arc discharge can be restricted. As a result, substances are less likely to adhere to walls of the vacuum vessels, etc. Moreover, even if, for example, the plasma generating power, pressure of the gas, etc. are increased in order to raise synthesis speed of the diamondlike thin film, abnormal discharge such as arc discharge is less likely to take place and thus, it becomes possible to synthesize the diamondlike thin film stably.

Furthermore, since the radicals containing carbon generated in the first vacuum vessel can be efficiently irradiated onto the substrate by pressure difference between the first and second vacuum vessels, the hydrocarbon gas is utilized highly efficiently and the diamondlike thin film can be synthesized at higher speed than the prior art in the same manner as in the first aspect of the present invention.

In the second aspect of the present invention, the diamondlike thin film is synthesized also on the mesh type electrode during synthesis of the diamondlike thin film on the substrate. Thus, when thickness of the diamondlike thin film synthesized on the mesh type electrode exceeds a predetermined value, the diamondlike thin film is readily separated from the mesh type electrode and thus, pieces of the diamondlike thin film separated from the mesh type electrode reach the substrate. In this case, the separated pieces of the diamondlike thin film are undesirably included, as foreign matter, into the diamondlike thin film synthesized on the substrate. This inconvenience can be eliminated by providing a supply means for continuously supplying a clean portion of the mesh type electrode to a front of the substrate. Namely, since the clean mesh type electrode free from foreign matter confronts the substrate at all times, such a phenomenon does not occur that the separated pieces of the diamondlike thin film are scattered towards the substrate from the mesh type electrode, so that the diamondlike thin film of high quality substantially free from inclusion of foreign matter for a long time can be synthesized on the substrate while possessing the advantages of the second aspect of the present invention. Consequently, the second aspect of the present invention is especially effective for continuously synthesizing the diamondlike thin film on, for example, a long filmy substrate.

BRIEF DESCRIPTION OF THE DRAWINGS

This object and features of the present invention will become apparent from the following description taken in conjunction with the preferred embodiments thereof with reference to the accompanying drawings, in which.

DETAILED DESCRIPTION OF THE INVENTION

Figure 2:
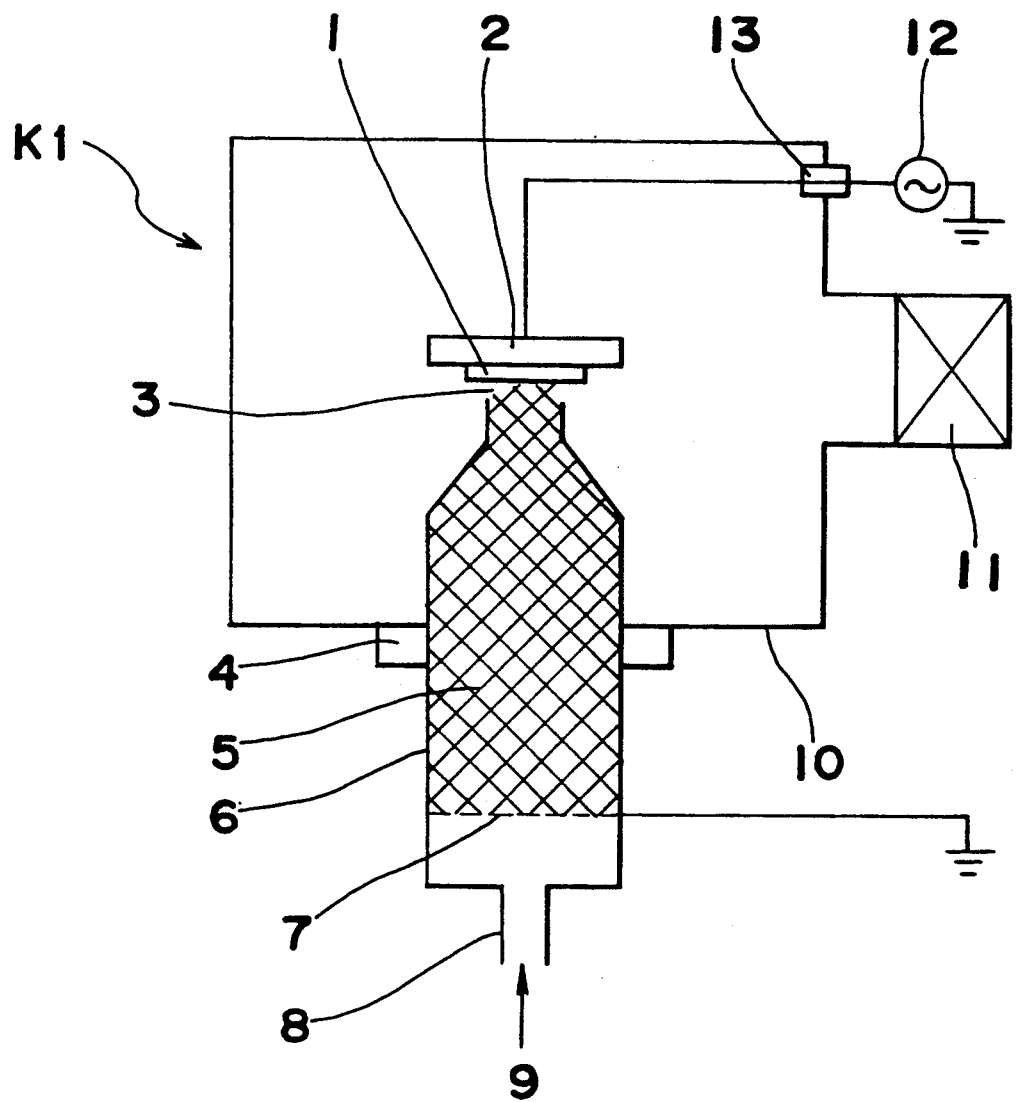
FIGS. 2 to 8 are schematic views of an apparatus for synthesizing a diamondlike thin film, according to first to seventh embodiments of the present invention, respectively.

Referring now to the drawings, there is shown in FIG. 2, an apparatus K1 for synthesizing a diamondlike thin film, according to a first embodiment of the present invention. The apparatus K1 includes a first vacuum vessel 6 and a second vacuum vessel 10. A distal end of the first vacuum vessel 6 is drawn like a nozzle. A mixed gas 9 of methane gas acting as raw material and argon gas acting as auxiliary gas is introduced into the first vacuum vessel 6 from an inflow portion 8. A mesh type internal electrode 7 is provided in the first vacuum vessel 6 and is grounded.

The first vacuum vessel 6 is coupled with the second vacuum vessel 10 by a flange 4 such that the first and second vacuum vessels 6 and 10 are evacuated by a vacuum pump 11. A substrate 1 is supported in the second vacuum vessel 10 by a support member 2 so as to be disposed in front of an outflow portion 3 of the first vacuum vessel 6. Pressures in the first and second vacuum vessels 6 and 10 are adjustable as follows. Namely, by raising flow resistance of the mixed gas 9 through adjustment of a gap between the outflow portion 3 and the substrate portion 1, pressure in the first vacuum vessel 6 can be easily so set as to be higher than that of the second vacuum vessel 10 by one figure or more. An RF power source 12 having an output frequency of 13.56 MHz is employed as an AC power source. It is desirable that output frequency of the RF power source 12 ranges from 1 kHz to 100 MHz, more preferably, from 100 kHz to 50 MHz. When an RF power is applied from the RF power source 12 to the support member 2 through an inlet terminal 13, plasma 5 is generated in the first vacuum vessel 6. This plasma 5 is irradiated onto the substrate 1 by pressure difference between the first and second vacuum vessels 6 and 10.

Then, one example of synthesis of the diamondlike thin film in the apparatus K1 is described. An ordinary plate glass of 1 mm in thickness is employed as the substrate 1 and is mounted on the support member 2. After the gap between the outflow portion 3 and the substrate 1 has been set at 2 mm, the first and second vacuum vessels 6 and 10 are evacuated to a pressure of $1 \times 10^{-5}$ Torr by the vacuum pump 11. Subsequently, the mixed gas 9 of methane gas and argon gas is introduced into the first vacuum vessel 6 from the inflow portion 8 and thus, the first vacuum vessel 6 is set at a pressure of 0.3 Torr. When the RF power of 170W is applied to the support member 2 from the RF power source 12, the plasma 5 is generated in the first vacuum vessel 6. At this time, pressure in the second vacuum vessel 10 is $7 \times 10^{-4}$ Torr and no plasma is generated in the second vacuum vessel 10. Meanwhile, a self-bias voltage of the substrate 1 is 560V. In this state, synthesis of the diamondlike thin film is performed for 10 min.

The diamondlike thin film is synthesized at an area corresponding to an area of an aperture of the outflow portion 3 of the first vacuum vessel 6. The synthesized diamondlike thin film has high quality of substantial uniformity. Namely, the obtained diamondlike thin film has a Knoop hardness of 3000–3100 at both its central portion and its peripheral portion and has a thickness of 11000–11500 Å at both its central portion and its peripheral portion. In this embodiment, the diamondlike thin film is synthesized at high speed, namely, synthesis speed of the diamondlike thin film is 1100 to 1150 Å/min. which is about 10 times that of the conventional apparatuses.

Meanwhile, when the RF power is raised, synthesis speed of the diamondlike thin film is increased advantageously. However, when the RF power is raised to about 600W or more in this embodiment, the plasma is generated in the second vacuum vessel 10 as a whole. Furthermore, when the RF power reaches about 900W, generation of arc discharge between the support member 2 and the second vacuum vessel 10 starts.

Figure 1:
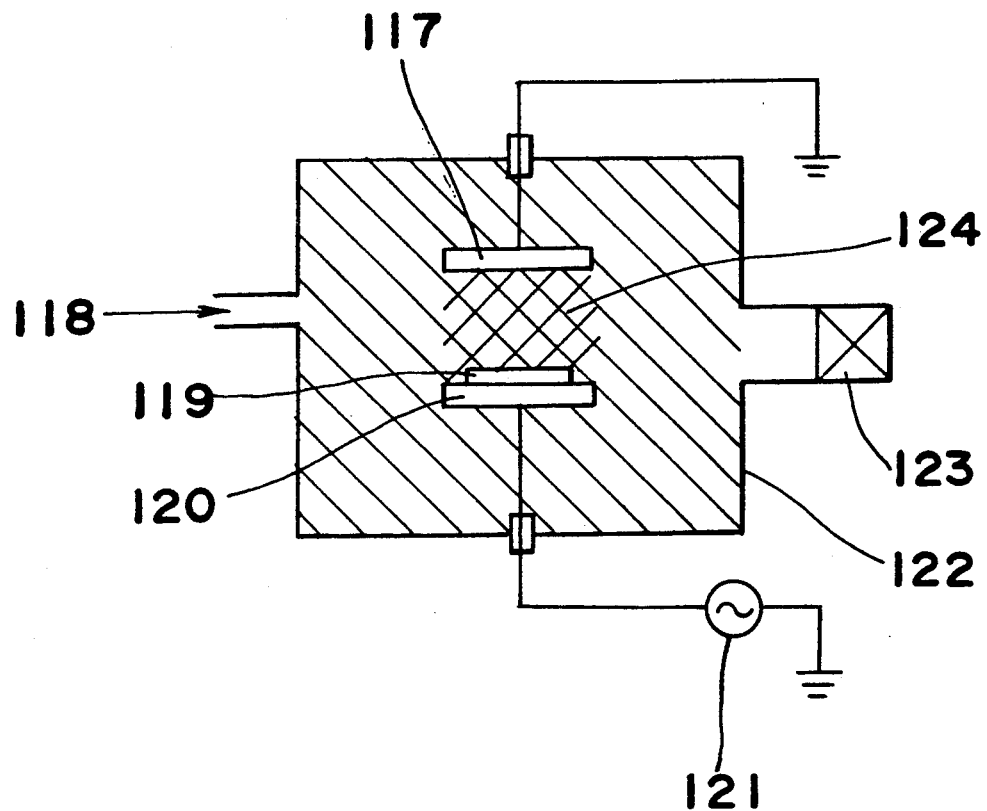
FIG. 1 is a schematic view of a prior art RF plasma CVD apparatus (already referred to)

Meanwhile, if the substrate 1 is provided such that the gap between the outflow portion 3 and the substrate 1 assumes 10 mm in FIG. 1, pressure in the second vacuum vessel 10 is 0.09 Torr when pressure in the first vacuum vessel 6 is 0.3 Torr. When the RF power of 170W is applied to the support member 2 in this state, plasma is generated also in the second vacuum vessel 10 as a whole. At this time, the diamondlike thin film is synthesized nonuniformly. Namely, the synthesized diamondlike thin film has a Knoop hardness of 2900 at its central portion and a Knoop hardness of 1800 at its peripheral portion. Meanwhile, the synthesized diamondlike thin film has a thickness of about 7000 Å and a thickness of about 3500 Å at its peripheral portion. It is to be noted that the gap between the outflow portion 3 and the substrate 1 is not restricted to the above mentioned values but may be set at any proper value in accordance with configuration and size of the apparatus K1, shape and size of the substrate 1, evacuation capacity of the vacuum pump 11, etc.

Figure 3:
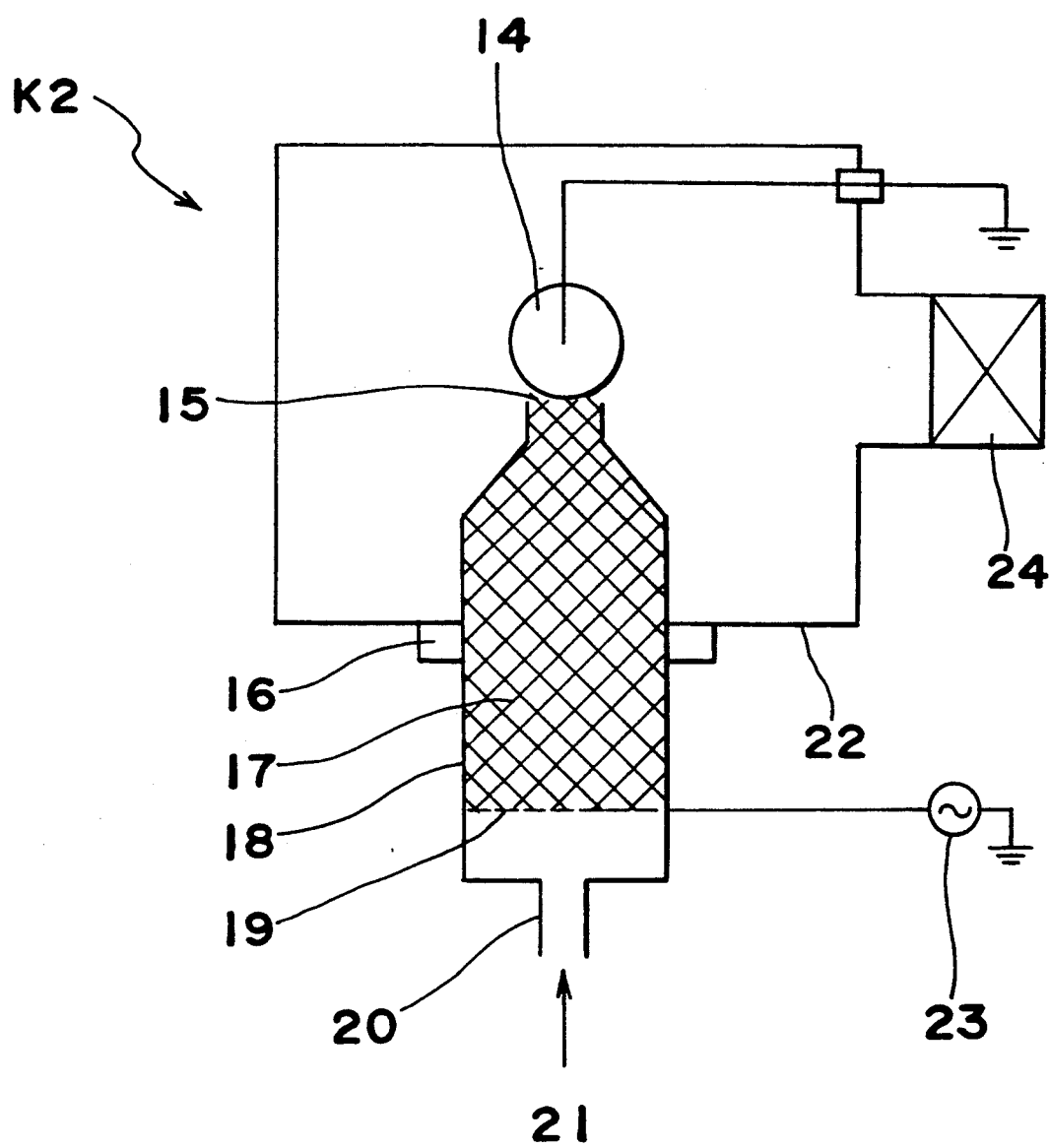

FIG. 3 shows an apparatus K2 according to a second embodiment of the present invention. In this embodiment, an RF power is applied to an internal electrode 19 provided in a first vacuum vessel 18. Meanwhile, a substrate 14 is formed by a cylinder made of aluminum and is rotatably supported by a rotational support member (not shown). A distal end of the first vacuum vessel 18 is drawn like an arcuate nozzle. Other constructions of the apparatus K2 are similar to those of the apparatus K1, description thereof is abbreviated for the sake of brevity.

Hereinbelow, one example of synthesis of the diamondlike thin film in the apparatus K2 is described. The substrate 14 is mounted on the rotational support member. After a gap between an outflow portion 15 and the substrate 14 has been so adjusted as to assume 2 mm, the first vacuum vessel 18 and a second vacuum vessel 22 are evacuated to a pressure of $1 \times 10^{-5}$ Torr by a vacuum pump 24. Subsequently, not only the substrate 14 is rotated by the rotational support member but a mixed gas 21 of methane gas and argon gas is introduced into the first vacuum vessel 18 from an inflow portion 20 and thus, the first vacuum vessel 18 is set at a pressure of 0.3 Torr. Thereafter, when an RF power of 170W is applied from an RF power source 23 to the internal electrode 19, plasma 17 is generated in the first vacuum vessel 18. At this time, pressure in the second pressure vessel 22 is $8 \times 10^{-4}$ Torr and no plasma is generated in the second vacuum vessel 22. Meanwhile, a self-bias voltage of the substrate 14 is 560V. In this state, synthesis of the diamondlike thin film is performed for 10 min.

The diamondlike thin film is synthesized at a width corresponding to a size of an aperture of the outflow portion 15 of the first vacuum vessel 18. The obtained diamondlike thin film has high quality of substantial uniformity. Namely, the synthesized diamondlike thin film has a Knoop hardness of 3000–3100 at both its central portion and its peripheral portion and has a thickness of 5500–5550 Å at both its central portion and its peripheral portion.

When the RF power is raised, synthesis speed of the diamondlike thin film is increased advantageously. In this embodiment, even if the RF power is raised to about 1000W or more, plasma is not produced in the second vacuum vessel 22. Furthermore, if the substrate 14 is provided such that the gap between the outflow portion 15 and the substrate 14 assumes 10 mm, pressure in the second vacuum vessel 22 is 0.09 Torr when pressure in the first vacuum vessel 18 is 0.3 Torr. When the RF power of 170W is applied to the internal electrode 19 in this state, plasma is generated also in the second vacuum vessel 22 as a whole. At this time, the diamondlike thin film is synthesized nonuniformly. Namely, the synthesized diamondlike thin film has a Knoop hardness of 2900 at its central portion and a Knoop hardness of 1800 at its peripheral portion. Meanwhile, the synthesized diamondlike thin film has a thickness of about 3000 Å at its central portion and a thickness of about 1700 Å at its peripheral portion. It is to be noted that the gap between the outflow portion 15 and the substrate 14 is not restricted to the above mentioned values but may be set at any proper value in accordance with configuration and size of the apparatus K2, shape and size of the substrate 14, evacuation capacity of the vacuum pump 24, etc.

In the present invention, it is possible to synthesize the high-quality diamondlike thin film even on the basis of synthesis conditions other than those recited in the first and second embodiments. Output frequency of the RF power source may be, for example, 27 MHz or an audio frequency of about 100 KHz. Meanwhile, such gases as ethylene, ethane, butane, benzene, pentane and propane may be used independently or mixedly as the hydrocarbon gas. Furthermore, rare gases such as helium, krypton and xenon or auxiliary gas such as hydrogen may be added to the above described gases used as the hydrocarbon gas. The substrate may be made of electrically conductive material such as stainless steel or insulating material such as plastics, etc. In addition, the substrate may have a solid shape, a platelike shape or a filmy shape.

Figure 4:
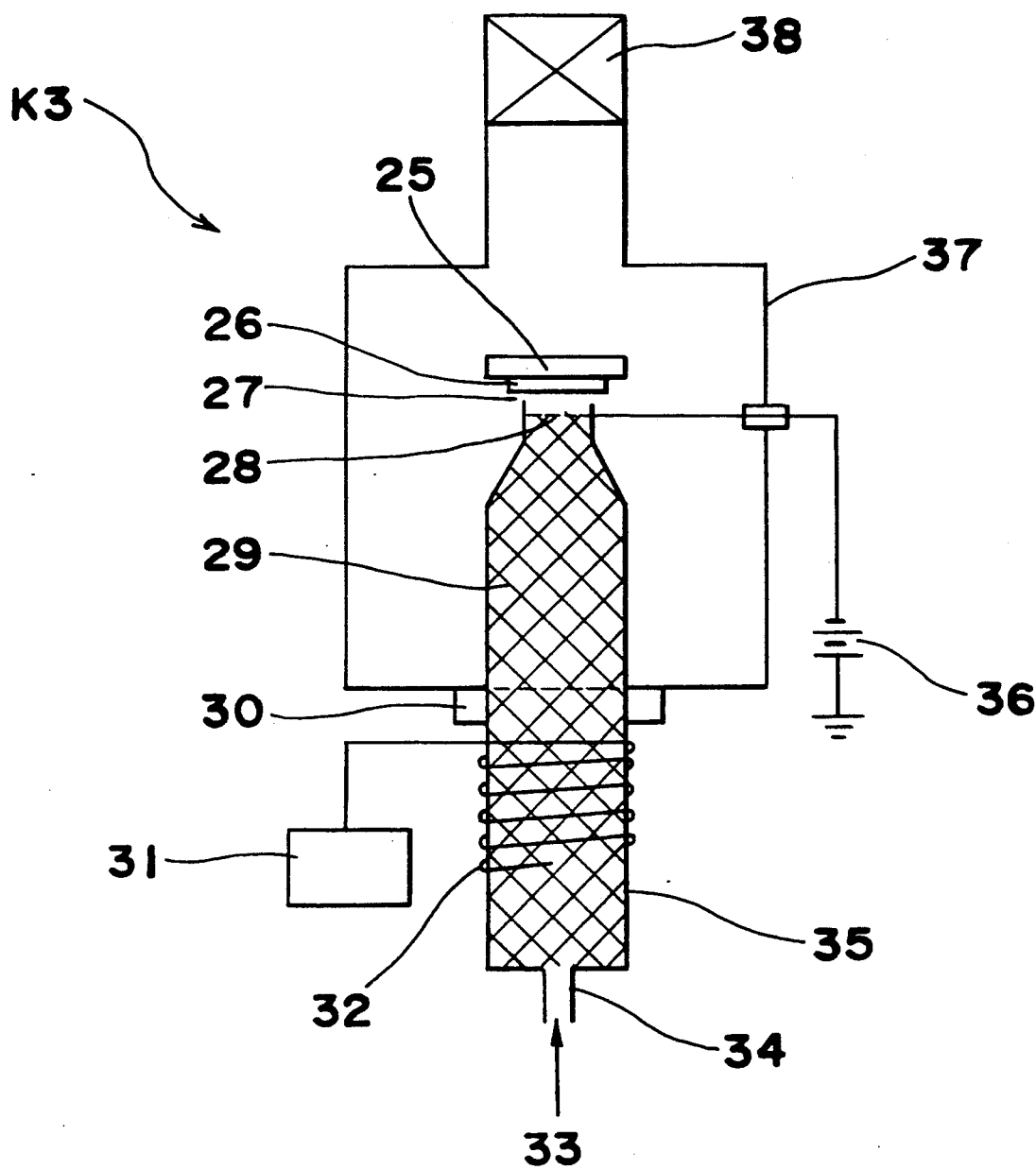

FIG. 4 shows an apparatus K3 according to a third embodiment of the present invention. A distal end of a first vacuum vessel 35 is drawn like a nozzle. A mixed gas 33 of methane gas acting as raw material and argon gas acting as auxiliary gas is introduced into the first vacuum vessel 35 from an inflow portion 34. The mixed gas 33 carried into the first vacuum vessel 35 is converted into plasma state by a plasma generating means constituted by an excitation coil 32 and an RF power source 31. The first vacuum vessel 35 is coupled with a second vacuum vessel 37 by a flange 30 such that the first and second vacuum vessels 35 and 37 are evacuated by a vacuum pump 38. A substrate 26 is supported in the second vacuum vessel 37 by a support member 25 so as to be disposed in front of an outflow portion 27 of the first vacuum vessel 35. Pressures in the first and second vacuum vessels 35 and 37 are adjustable as follows. Namely, by raising flow resistance of the mixed gas 33 through adjustment of a gap between the outflow portion 27 and the substrate 26, pressure in the first vacuum vessel 35 can be easily so set as to be higher than that of the second vacuum vessel 37. Plasma 29 generated in the first vacuum vessel 35 is caused to flow towards the substrate 26 through the outflow portion 27 by this pressure difference between the first and second vacuum vessels 35 and 37.

A mesh type electrode 28 is provided in the flow path of the plasma 29. A negative potential is applied to the mesh type electrode 28 from a DC power source 36 acting as a voltage applying means. Since the plasma 29 is irradiated onto the substrate 26 through the mesh type electrode 28, particles obtained by removing ions from the plasma 29 are irradiated onto the substrate 26.

Hereinbelow, one example of synthesis of the diamondlike thin film in the apparatus K3 is described. An ordinary plate glass of 1 mm in thickness is employed as the substrate 26 and is mounted on the support member 25. After the gap between the outflow portion 27 and the substrate 26 has been set at 2 mm, the first and second vacuum vessels 35 and 37 are evacuated to a pressure of $1 \times 10^{-5}$ Torr by the vacuum pump 38. Subsequently, the mixed gas 33 of methane gas and argon gas is introduced into the first vacuum vessel 35 from the inflow portion 34 and thus, the first vacuum vessel 35 is set at a pressure of 0.3 Torr. Thereafter, when a DC potential of $-700$V is applied to the mesh type electrode 28 by the DC power source 36 and an RF power of 170W is applied to the excitation coil 32 from the RF power source 31, the plasma 29 is generated in the first vacuum vessel 35. At this time, pressure in the second vacuum vessel 37 is $7 \times 10^{-4}$ Torr and no plasma is generated in the second vacuum vessel 37. In this state, synthesis of the diamondlike thin film is performed for 10 min.

The diamondlike thin film is synthesized at an area corresponding to an area of an aperture of the outflow portion 27 of the first vacuum vessel 35. The obtained diamondlike thin film has high quality of substantial uniformity. Namely, the synthesized diamondlike thin film has a Knoop hardness of 3000–3100 at both its central portion and its peripheral portion and has a thickness of 12000–12500 Å at both its central portion and its peripheral portion. In this embodiment, the diamondlike thin film is synthesized at high speed, namely, synthesis speed of the diamondlike thin film is 1200 to 1250 Å/min. which is about 10 times that of the conventional apparatuses.

Furthermore, if the substrate 26 is provided such that the gap between the outflow portion 27 and the substrate 26 assumes 10 mm in FIG. 4, pressure in the second vacuum vessel 37 is 0.09 Torr when pressure in the first vacuum vessel 35 is 0.3 Torr. When the RF power of 170W is applied to the excitation coil 32 in this state, the plasma is generated also in the second vacuum vessel 37 as a whole. The synthesized diamondlike thin film has a Knoop hardness of 2900 at its central portion and a Knoop hardness of 1800 at its peripheral portion. Meanwhile, the synthesized diamondlike thin film has a thickness of about 7000 Å at its central portion and a thickness of about 3500 Å. It is to be noted that the gap between the outflow portion 27 and the substrate 26 is not restricted to the above mentioned values but may be set at any proper value in accordance with configuration and size of the apparatus K3, shape and size of the substrate 26, evacuation capacity of the vacuum pump 38, etc.

Moreover, an experiment was conducted in which an aluminum cylinder having an organic photosensitive layer is employed as the substrate 26 and the diamondlike thin film is synthesized on the surface of the aluminum cylinder. Results of the experiment reveal that the diamondlike thin film of high quality equivalent to that of the diamondlike thin film obtained in this embodiment is synthesized. When this photosensitive member is mounted on a copying apparatus and printing is performed by the copying apparatus, printing as vivid as conventional photosensitive members having no diamondlike thin film can be effected without damage to the photosensitive member. Thus, the photosensitive member does not deteriorate printing characteristics of the copying apparatus.

Meanwhile, also in this embodiment, such gases as ethylene, ethane, butane, benzene, pentane and propane may be used independently or mixedly as the hydrocarbon gas. Furthermore, rare gases such as helium, krypton and xenon or auxiliary gas such as hydrogen may be added to the above described gases used as the hydrocarbon gas. The substrate may be made of electrically conductive material such as stainless steel or insulating material such as plastics, etc. In addition, the substrate may have a solid shape, a platelike shape or a filmy shape.

Figure 5:
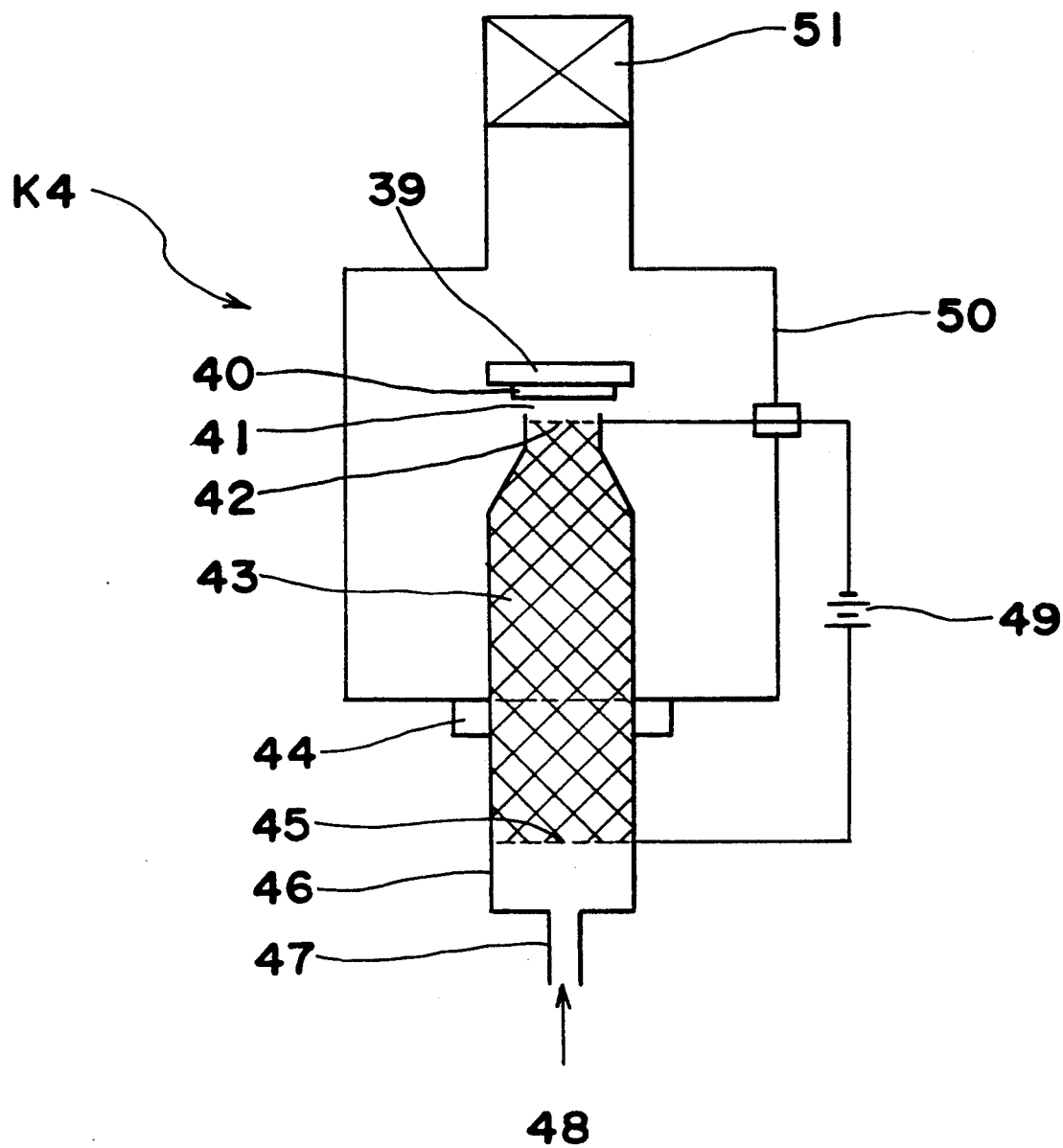

FIG. 5 shows an apparatus K4 according to a fourth embodiment of the present invention. The apparatus K4 includes a first vacuum vessel 46, a second vacuum vessel 50 and a substrate 40 in the same manner as the apparatus K3. The apparatus K4 is different from the apparatus K3 in that a mesh type internal electrode 45 is provided in the first vacuum vessel 46 in the apparatus K4. As a result, in the apparatus K4, a mesh type electrode 42 and a DC power source 49 acting as a voltage applying means serve not only to remove ions but to generate plasma. Thus, the apparatus K4 is simplified in construction as compared with the apparatus K3.

In the apparatus K4, a mixed gas 48 of methane gas and argon gas is introduced into the first vacuum vessel 46 from an inflow portion 47. The mesh type internal electrode 45 is provided in the first vacuum vessel 46, while the mesh type electrode 42 is provided in front of a substrate 40. When a voltage is applied between the mesh type internal electrode 45 and the mesh type electrode 42 by the DC power source 49 such that the mesh type electrode 42 has a potential lower than that of the mesh type internal electrode 45, the mixed gas 48 carried into the first vacuum vessel 46 is converted into plasma state. The substrate 40 is supported in the second vacuum vessel 50 by a support member 39 so as to be disposed in front of an outflow portion 41 of the first vacuum vessel 46. Pressures in the first and second vacuum vessels 46 and 50 are adjustable as follows. Namely, by raising flow resistance of the mixed gas 48 through adjustment of a gap between the outflow portion 41 and the substrate 40, pressure in the first vacuum vessel 46 can be easily so set as to be higher than that of the second vacuum vessel 50. Plasma 43 generated in the first vacuum vessel 46 is caused to flow towards the substrate 40 through the outflow portion 41 by this pressure difference between the first and second vacuum vessels 46 and 50.

The mesh type electrode 42 is provided in the flow path of the plasma 43. A negative potential is applied to the mesh type electrode 42 by the DC power source 49 acting as the voltage applying means. Since the plasma 43 is irradiated onto the substrate 40 through the mesh type electrode 42, particles obtained by removing ions from the plasma 43 are irradiated onto the substrate 40.

Hereinbelow, one example of synthesis of the diamondlike thin film in the apparatus K4 is described. An ordinary plate glass of 1 mm in thickness is employed as the substrate 40 and is mounted on the support member 39. After the gap between the outflow portion 41 and the substrate 40 has been set at 2 mm, the first and second vacuum vessels 46 and 50 are evacuated to a pressure of $1 \times 10^{-5}$ Torr by a vacuum pump 51. Subsequently, the mixed gas 48 of methane gas and argon gas is introduced into the first vacuum vessel 46 from the inflow portion 47 and thus, the first vacuum vessel 46 is set at a pressure of 0.3 Torr. Thereafter, when a DC potential of $-700V$ is applied to the mesh type electrode 42 relative to the internal electrode 45 by the DC power source 49, the plasma 43 is generated in the first vacuum vessel 46. At this time, pressure in the second vacuum vessel 50 is $7 \times 10^{-4}$ Torr and no plasma is generated in the second vacuum vessel 50. In this state, synthesis of the diamondlike thin film is preformed for 10 min.

The diamondlike thin film is synthesized at an area corresponding to an area of an aperture of the outflow portion 41 of the first vacuum vessel 46. The obtained diamondlike thin film has high quality of substantial uniformity. Namely, the synthesized diamondlike thin film has a Knoop hardness of 3000-3100 at both its central portion and its peripheral portion and has a thickness of 9600-9700 Å at both its central portion and its peripheral portion. In this embodiment, the diamondlike thin film is synthesized at high speed, namely, synthesis speed of the diamondlike thin film is 960 to 970 Å/min. which is about 10 times that of the conventional apparatuses.

Furthermore, if the substrate 40 is provided such that the gap between the outflow portion 41 and the substrate 40 assumes 10 mm in FIG. 5, pressure in the second vacuum vessel 50 is 0.09 Torr when pressure in the first vacuum vessel 46 is 0.3 Torr. When the DC potential of $-700V$ is applied to the mesh type electrode 42 by the DC power source 49, plasma is generated also in the second vacuum vessel 50 as a whole. The synthesized diamondlike thin film has a Knoop hardness of 2900 at its central portion and a Knoop hardness of 1800 at its peripheral portion. Meanwhile, the synthesized diamondlike thin film has a thickness of about 7000 Å at its central portion and a thickness of about 3500 Å at its peripheral portion.

Moreover, an experiment was conducted in which an aluminum cylinder having an organic photosensitive layer is employed as the substrate 40 and the diamondlike thin film is synthesized on the surface of the aluminum cylinder. Results of the experiment show that the diamondlike thin film of high quality equivalent to that of the diamondlike thin film obtained in this embodiment is synthesized. When this photosensitive member is mounted on a copying apparatus and printing is performed by the copying apparatus, printing as vivid as conventional photosensitive members having no diamondlike thin film can be effected without damage to the photosensitive member. Thus, the photosensitive member does not deteriorate printing characteristics of the copying apparatus.

Figure 6:
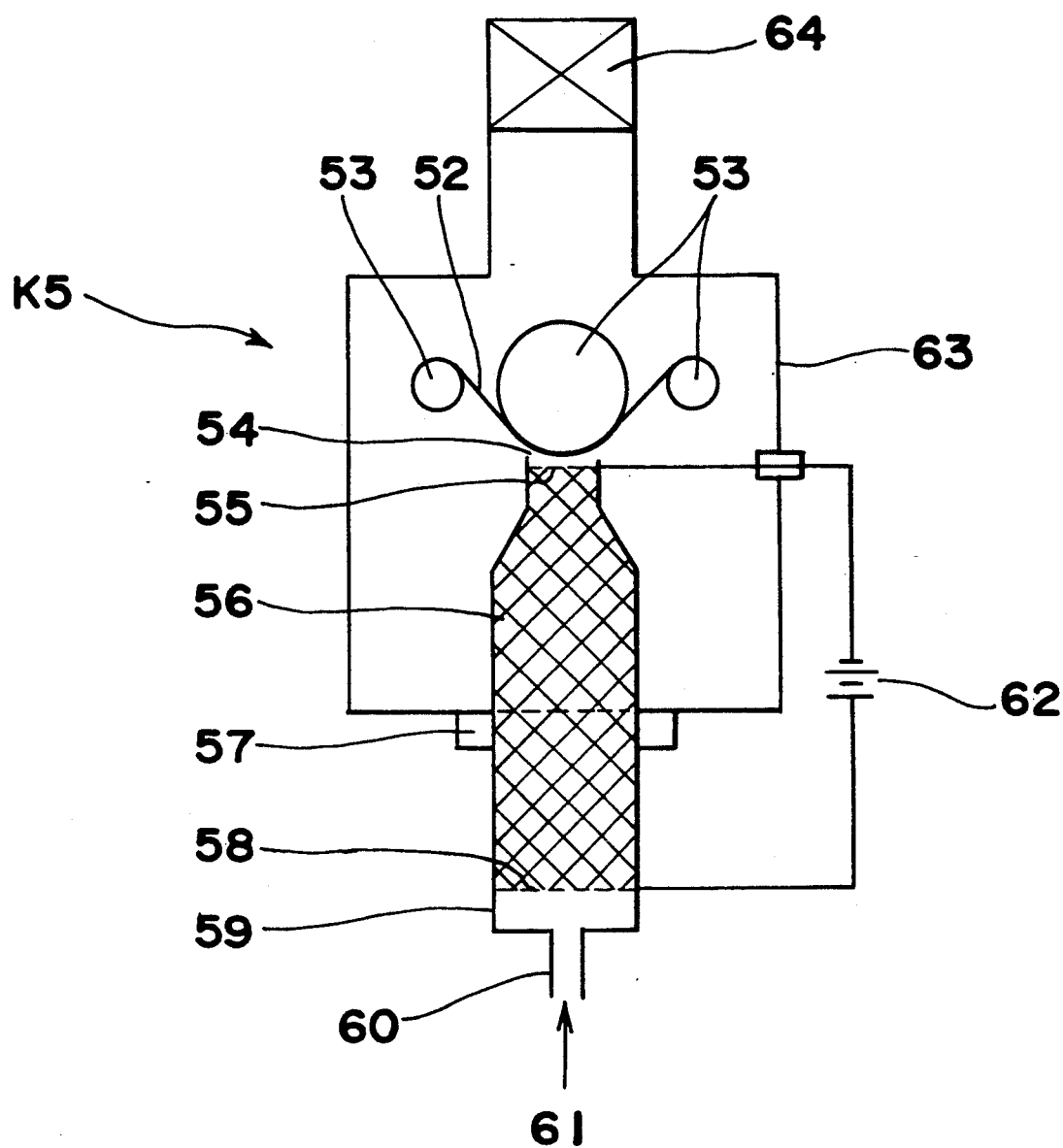

FIG. 6 shows an apparatus K5 according to a fifth embodiment of the present invention. In the apparatus K5, a long filmy substrate 52 is employed in place of the substrate 40 of the apparatus K4 of FIG. 5. Other constructions of the apparatus K5 are similar to those of the apparatus K4. The filmy substrate 52 is continuously conveyed by a film transport mechanism 53 such that the diamondlike thin film is synthesized on the long filmy substrate 52. Supposing that the diamondlike thin film of 0.1 μm in thickness is synthesized on the filmy substrate 52 of 100 m in length under the former synthesis conditions of the apparatus K4, transport speed of the filmy substrate 52 is about 1 m/min. and it takes about 100 min. to synthesize the diamondlike thin film on the filmy substrate 52. Also, in this embodiment, the diamondlike thin film of high quality substantially free from nonuniformity in thickness is synthesized so as to have a Knoop hardness of 3000-3100.

However, after the filmy substrate 52 has been fed through a distance of about 30 m, namely, after about 30 min. have elapsed from start of synthesis of the diamondlike thin film, it is found that foreign matter is included into the diamondlike thin film synthesized on the filmy substrate 52. Furthermore, investigations have revealed that the diamondlike thin film synthesized on a mesh type electrode 55 is separated from the mesh type electrode 55 and is scattered towards the filmy substrate 52 so as to form the foreign matter.

Meanwhile, also in this embodiment, such gases as ethylene, ethane, butane, benzene, pentane and propane may be used independently or mixedly as the hydrocarbon gas. Furthermore, rare gases such as helium, krypton and xenon or auxiliary gas such as hydrogen may be added to the above described gases used as the hydrocarbon gas. The substrate may be made of electrically conductive material such as stainless steel or insulating material such as plastics, etc. In addition, the substrate may have a solid shape, a platelike shape or a filmy shape.

Figure 7:
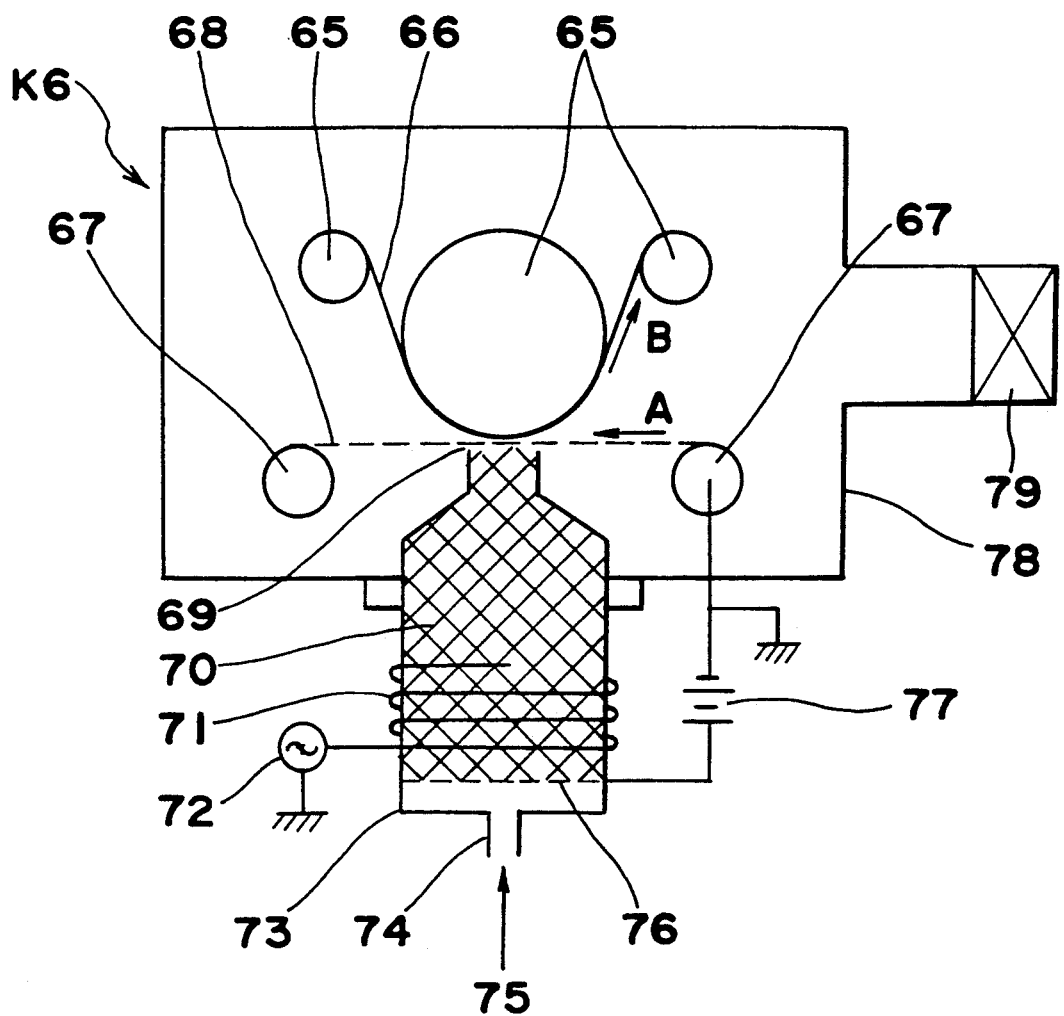

FIG. 7 shows an apparatus K6 according to a sixth embodiment of the present invention. In the apparatus K6, a mesh type electrode 68 has a long band-like shape. At the time of synthesis of the diamondlike thin film, the mesh type electrode 68 is displaced in the direction of the arrow A in FIG. 7 by a pair of continuous winding and rewinding rollers 67 acting as an electrode supply means. Thus, a new and clean mesh type electrode free from the diamondlike thin film is supplied in front of a substrate at all times.

Hereinbelow, one example of synthesis of the diamondlike thin film in the apparatus K6 is described. A film 66 made of organic photosensitive material is employed as the substrate. Initially, the film 66 is loaded on a film transport mechanism 65 in a second vacuum vessel 78. Then, first and second vacuum vessels 73 and 78 are evacuated to a pressure of $1 \times 10^{-5}$ Torr by a pressure pump 79. Subsequently, the mesh type electrode 68 is displaced in the direction of the arrow A by the continuous winding and rewinding rollers 67 and the film 66 is transported in the direction of the arrow B by the film transport mechanism 65. Thereafter, a mixed gas 75 of methane gas and argon gas is introduced into the first vacuum vessel 73 from an inflow portion 74 and thus, the first vacuum vessel 73 is set at a pressure of 0.3 Torr. Furthermore, a DC potential of −500V is applied to the mesh type electrode 68 relative to an internal electrode 76 by a DC power source 77. Meanwhile, when an RF power of 170W is applied to an excitation electrode 71 by an RF power source 72, plasma 70 is generated in the first vacuum vessel 73 such that the diamondlike thin film is synthesized on the film 66. At this time, pressure in the second vacuum vessel 78 is $7 \times 10^{-4}$ Torr and no plasma is generated in the second vacuum vessel 78.

In this embodiment, when the diamondlike thin film of 0.1 μm in thickness is uniformly synthesized on the film 66 having a length of 100 m and a width of 30 cm by setting feed rate of the mesh type electrode 68 at 0.1 m/min. or more, no foreign matter such as pieces of the diamondlike thin film separated from the mesh type electrode 68 is included into the diamondlike thin film synthesized on the film 66. When this feed rate of the mesh type electrode 68 is too small, inclusion of foreign matter into the diamondlike thin film takes place undesirably. When the diamondlike thin film has been synthesized on a whole face of the film 66 as described above, the first and second vacuum vessel 73 and 78 are communicated with atmosphere and the film 66 is removed from the film transport mechanism 65 such that processing for the next film 66 is started. At this time, the diamondlike thin film has already been synthesized on the mesh type electrode 68. Therefore, it is desirable to replace the used mesh type electrode 68 with a new one.

Meanwhile, in this embodiment, the plasma is generated by the RF power source 72 and the excitation coil 71 and ions are removed by the DC power source 77 and the mesh type electrode 68. However, it can also be so arranged as in the apparatus K4 that the DC power source and the mesh type electrode serve not only to generate the plasma but to remove ions.

Figure 8:
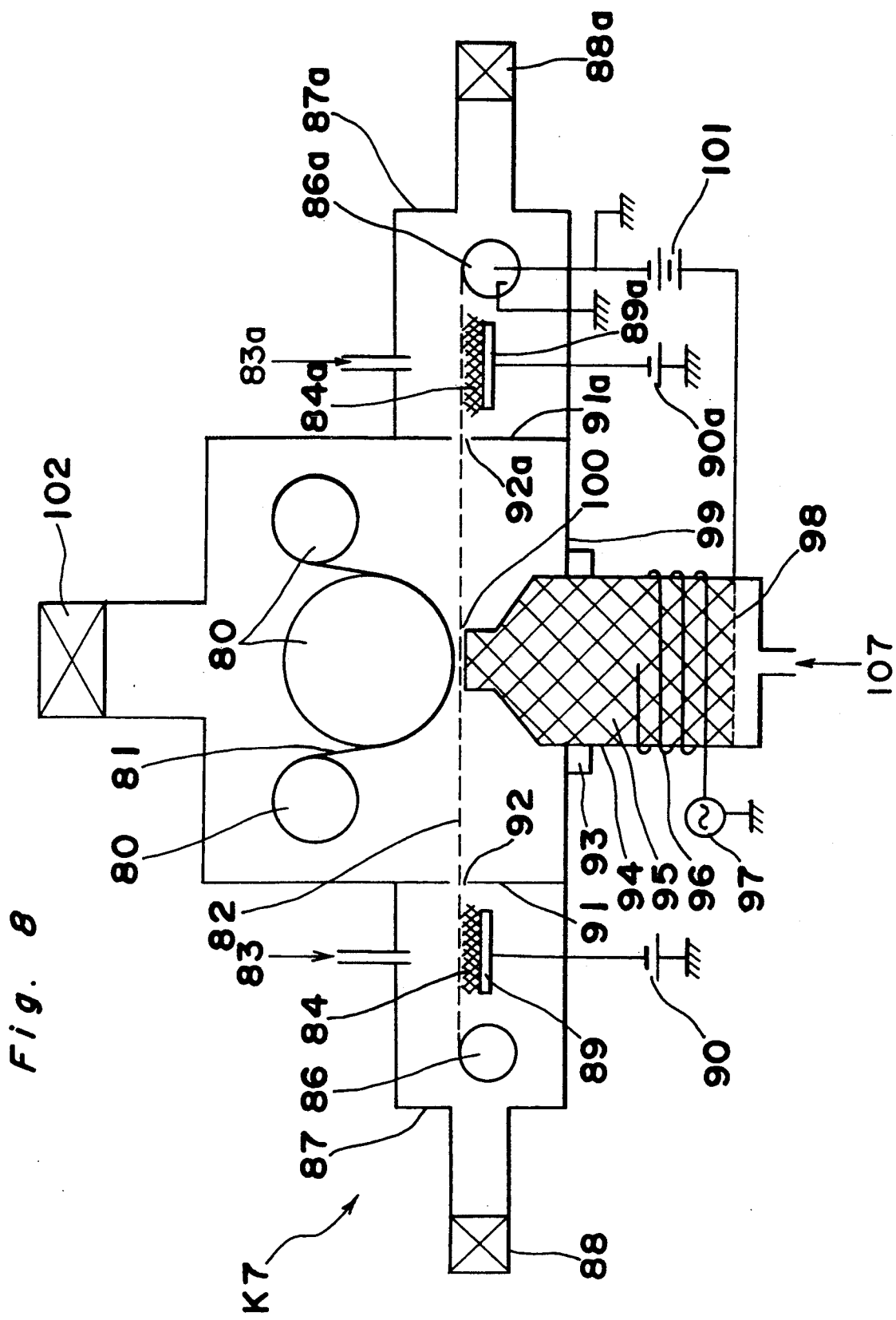

FIG. 8 shows an apparatus K7 according to a seventh embodiment of the present invention. In the apparatus K7, the mesh type electrode 68 of the apparatus K6 can be used repeatedly by removing substances adhering to the mesh type electrode 68 such that the diamondlike thin film can be synthesized on the further longer film. Operations of synthesis of the diamondlike thin film in the apparatus K7 are similar to those of the apparatus K6.

The apparatus K7 includes removal portions 87 and 87a for removing substances adhering to a mesh type electrode 82. The removal portions 87 and 87a are, respectively, separated from a second vacuum vessel 99 by partition walls 91 and 91a. The partition walls 91 and 91a have openings 92 and 92a for passing the mesh type electrode 82 therethrough, respectively. The removal portions 87 and 87a employ oxygen plasma etching.

The removal portions 87 and 87a are, respectively, evacuated by vacuum pumps 88 and 88a simultaneously with evacuation of a first vacuum chamber 94 and the second vacuum vessel 99 by a vacuum pump 102. Subsequently, oxygen gases 83 and 83a are, respectively, introduced into the removal portions 87 and 87a so as to set the removal portions 87 and 87a at a pressure of 0.1 Torr. Thereafter, a DC voltage is applied to electrodes 89 and 89a of the removal portions 87 and 87a by DC power sources 90 and 90a so as to generate oxygen plasmas 84 and 84a in the removal portions 87 and 87a, respectively. A number of particles such as oxygen radicals and oxygen ions are present in the oxygen plasmas 84 and 84a and these particles cause vigorous oxidation reaction with carbon, a constituent element of the diamondlike thin film so as to change the carbon into carbon monoxide, carbon dioxide, etc. such that these carbon monoxide, carbon dioxide, etc. are discharged into the removal portions 87 and 87a. Since this oxidation reaction takes place vigorously at the side of positive potential, it is preferable that the mesh type electrode 82 has positive potential relative to the electrodes 89 and 89a as shown in FIG. 8.

Configuration and size of the removal portions 87 and 87a and operating conditions of the removal portions 87 and 87a are so set that the diamondlike thin film synthesized on the mesh type electrode 82 is sufficiently removed by the removal portions 87 and 87a.

As described above, in this embodiment, the removal portions are provided for effectively removing the diamondlike thin film synthesized on the mesh type electrode 82. Since the mesh type electrode 82 is reciprocated by continuous winding and rewinding rollers 86 and 86a while being cleaned by the removal portions 87 and 87a, a clean portion of the mesh type electrode 82 can be so set as to confront a face of a film 81 at all times. Therefore, it becomes possible to synthesize the diamondlike thin film on the film 81 of large capacity.

As a result, in this embodiment, the diamondlike thin film of 0.1 μm in thickness free from foreign matter such as pieces of the diamondlike thin film separated from the mesh type electrode 82 can be uniformly synthesized on the film 81 of 500 m in length and 30 cm in width by setting feed rate of the mesh type electrode 82 at 0.1 m/min. or more. When this feed rate of the mesh type electrode 82 is too small, foreign matter is undesirably included into the diamondlike thin film.

Meanwhile, in this embodiment, the second vacuum vessel 99 accommodating the film 81 subjected to synthesis of the diamondlike thin film is separated from the removal portions 87 and 87a by the partition walls 91 and 91a having the openings 92 and 92a for passing the mesh type electrode 82 therethrough, respectively. The partition walls 91 and 91a are primarily designed to prevent such a phenomenon in which oxygen gas in the removal portions 87 and 87a leaks into the second vacuum vessel 99 and thus, adversely affects synthesis of the diamondlike thin film. Therefore, in this case, it is desirable that each of the openings 92 and 92a has a size smaller than a sum of thickness of the mesh type electrode 82 and mean free path of gaseous molecules at pressure in the removal portions 87 and 87a. This size of each of the openings 92 and 92a is not restricted to the above description but can be properly selected in accordance with synthesis conditions of the diamondlike thin film, removal methods employed in the removal portions 87 and 87a, removal conditions of the removal portions 87 and 87a, etc.

Meanwhile, the above described oxidation reaction in the removal portions 87 and 87a is promoted by, for example, heating the mesh type electrode 82 with a halogen lamp or the like. Therefore, by providing such heating means in the removal portions 87 and 87a, it is also possible to make the mesh type electrode 82 more compact. Furthermore, in this embodiment, oxygen plasma etching is employed in the removal portions 87 and 87a but instead, plasma etching and ion beam etching which utilize at least one of hydrogen, fluorine and inert elements may also be employed. Furthermore, it can also be so arranged that, for example, a brush made of stainless steel is additionally brought into direct sliding contact with the mesh type electrode 82 so as to mechanically scrape the diamondlike thin film from the mesh type electrode 82.

Moreover, in this embodiment, plasma 95 is generated by an RF power source 97 and an excitation coil 96, while ions are removed by a DC power source 101 and the mesh type electrode 82. However, it can also be so arranged as in the apparatus K4 that the DC power source 101 and the mesh type electrode 82 not only generate the plasma 95 but remove ions. Meanwhile, also in this embodiment, such gases as ethylene, ethane, butane, benzene, pentane and propane may be used independently or mixedly as the hydrocarbon gas. Furthermore, rare gases such as helium, krypton and xenon or auxiliary gas such as hydrogen may be added to the above described gases used as the hydrocarbon gas. The substrate may be made of electrically conductive material such as stainless steel or insulating material such as plastics, etc. In addition, the substrate may have a solid shape, a platelike shape or a filmy shape.

The apparatuses K3 to K7 according to the third to seventh embodiments of the present invention, respectively exhibit remarkable effects in the case where it is highly necessary to uniformly synthesize the diamondlike thin film on the substrate.

Figure 9:
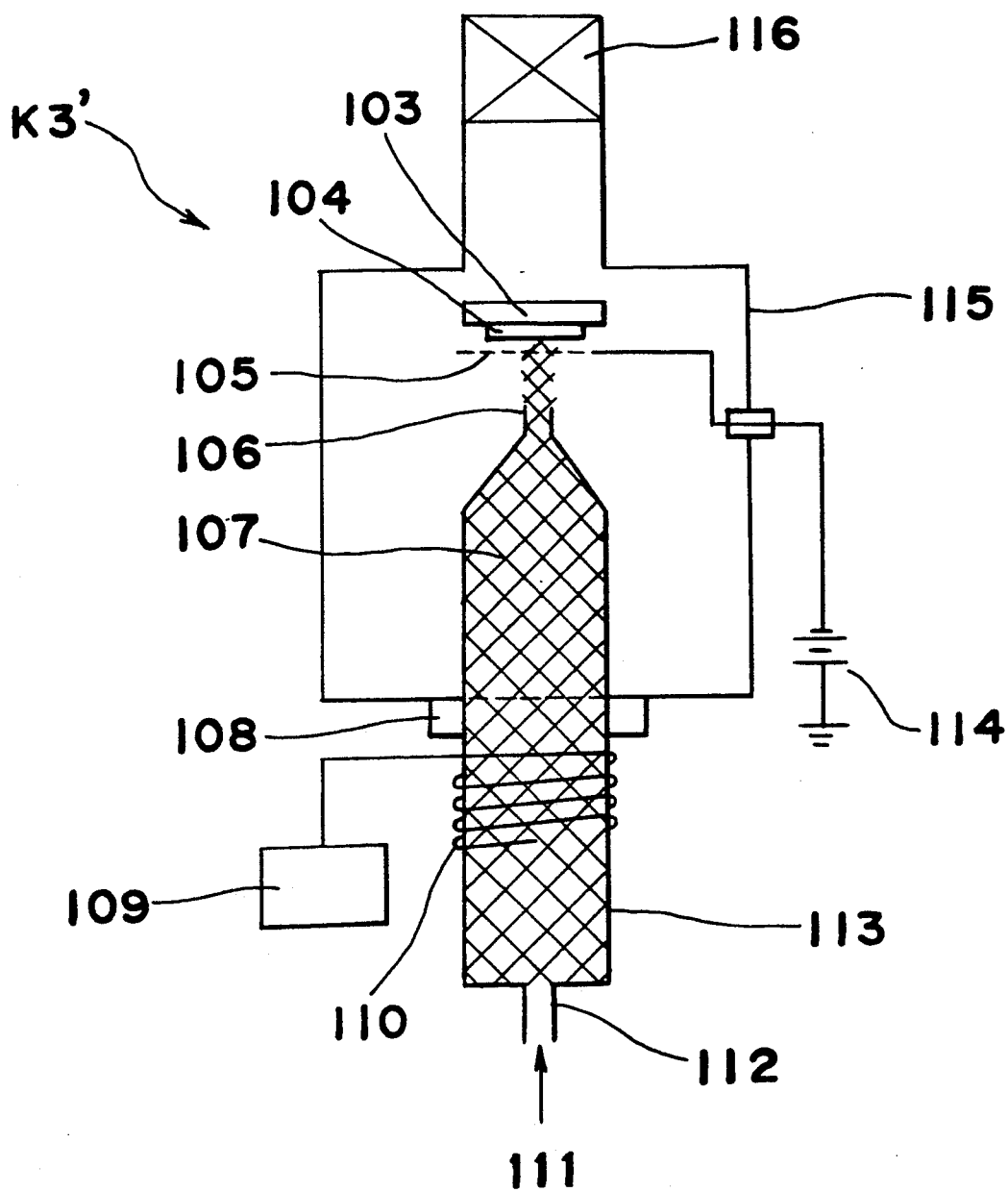
FIG. 9 is a view similar to FIG. 4, particularly showing a modification thereof.

Finally, FIG. 9 shows an apparatus K3' which is a modification of the apparatus K3. In the apparatus K3', an outflow portion 106 is further drawn to a size far smaller than that of the apparatus K3. Furthermore, in the apparatus K3', a gap between the outflow portion 106 and a substrate 104 is set at 100 mm which is considerably larger than that of the apparatus K3. Other constructions of the apparatus K3' are similar to those of the apparatus K3. In the apparatus K3', the diamondlike thin film is synthesized on the same operating conditions of the apparatus K3. At this time, pressure in a second vacuum vessel 115 is 0.05 Torr. The synthesized diamondlike thin film has a Knoop hardness of 2800 at its central portion and a Knoop hardness of 1600 at its peripheral portion. Furthermore, the obtained diamondlike thin film has a thickness of 6000 Å at its central portion and a thickness of 3000Å at its peripheral portion. Even in this modification, if the diamondlike thin film is synthesized while the substrate 104 is being rotated, the above mentioned nonuniformities in hardness and thickness of the diamondlike thin film are obviated substantially and thus, it becomes possible to synthesize the diamondlike thin film uniformly.

As is clear from the foregoing description, in the present invention, the diamondlike thin film of high quality uniform in characteristics and thickness can be stably synthesized on even an insulating substrate at high speed.

Furthermore, in the present invention, maintenance operations such as cleaning of the vacuum vessel is not required to be performed substantially, thereby resulting in improvement of operating conditions. Thus, in accordance with the present invention, industrial application of the diamondlike thin film can be extended to wear-resistant protective films for various electronic apparatuses or components, passivation films, etc.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An apparatus for synthesizing a diamondlike thin film on a substrate, comprising:
   a first vacuum vessel which has an inflow portion and an outflow portion for gas containing hydrocarbon gas;
   a plasma generating means for converting the gas into plasma in said first vacuum vessel;
   a second vacuum vessel which is coupled with said first vacuum vessel so as to allow the gas to flow between said outflow portion of said first vacuum vessel and said second vacuum vessel and has a pressure lower than that of said first vacuum vessel;
   said substrate being provided in said second vacuum vessel;
   a mesh type electrode which is provided upstream of said substrate in a flow path of the gas between said first vacuum vessel and said second vacuum vessel;
   a voltage applying means for applying a voltage to said mesh type electrode; and
   a supply means for continuously supplying a clean portion of said mesh type electrode to a front of said substrate.

2. An apparatus as claimed in claim 6, further comprising:
   a removal means for removing the diamondlike thin film synthesized on said mesh type electrode, which is separated from said second vacuum vessel by a partition wall having an opening for passing said mesh type electrode therethrough;
   wherein the diamondlike thin film synthesized on said mesh type electrode is removed from said mesh type electrode by said removal means such that the clean portion of said mesh type electrode is continuously supplied to the front of said substrate by said supply means.

3. An apparatus as claimed in claim 2, wherein plasma etching utilizing at least one of oxygen, hydrogen, fluorine and inert elements is employed in said removal means.

4. An apparatus as claimed in claim 2, wherein ion beam etching utilizing at least one of oxygen, hydrogen, fluorine and inert elements is employed in said removal means.

* * * * *